US012573537B2

(12) United States Patent
Riera Cercado et al.

(10) Patent No.: US 12,573,537 B2
(45) Date of Patent: Mar. 10, 2026

(54) EMBEDDABLE COUPLED INDUCTORS FOR PACKAGED SEMICONDUCTOR DEVICES

(71) Applicant: Saras Micro Devices, Inc., Chandler, AZ (US)

(72) Inventors: Carlos Andres Riera Cercado, Atlanta, GA (US); Urmi Ray, San Diego, CA (US); Markondeyaraj Pulugurtha, Miami, FL (US); Veeru Jaiswal, Miami, FL (US)

(73) Assignee: Saras Micro Devices, Inc., Chandler, AZ (US)

( * ) Notice: Subject to any disclaimer, the term of this patent is extended or adjusted under 35 U.S.C. 154(b) by 5 days.

(21) Appl. No.: 18/746,605

(22) Filed: Jun. 18, 2024

(65) Prior Publication Data

US 2025/0385033 A1      Dec. 18, 2025

(51) Int. Cl.
H01F 41/02          (2006.01)
H01F 27/24          (2006.01)
(Continued)

(52) U.S. Cl.
CPC ......... H01F 27/2804 (2013.01); H01F 27/24 (2013.01); H01F 41/0206 (2013.01);
(Continued)

(58) Field of Classification Search
CPC .. H01F 27/2804; H01F 27/24; H01F 41/0206; H01F 41/041; H01F 2027/2809;
(Continued)

(56) References Cited

U.S. PATENT DOCUMENTS 5,793,272 A  *  8/1998  Burghartz ........... H01L 23/5227
                                                    336/200
6,996,892 B1 *  2/2006  Dening ................. H05K 1/165
                                                    336/200
(Continued)

OTHER PUBLICATIONS

Micromachines. "Focused Electron Beam-Based 3D Nanoprinting forScanning Probe Microscopy: A Review;" Harold Plank et al.; http://www.mdpi.com/journal/micromachines.

Primary Examiner — Donghai D Nguyen
(74) Attorney, Agent, or Firm — Stetina Garred Brucker & Newboles

(57) ABSTRACT

A package substrate for a semiconductor device includes a substrate core and a coupled inductor embedded in the substrate core. The coupled inductor may include a double clad laminate having a dielectric layer and first and second metal layers sandwiching the dielectric layer. The first and second metal layers may be patterned to define spiral windings. The coupled inductor may further include first and second magnetic core layers sandwiching the double clad laminate. Alternatively, the coupled inductor may include a magnetic core embedded in a dielectric substrate and first and second conductive windings surrounding the magnetic core. Each of the first and second conductive windings may include one or more first segments defined by metal patterning in a plane parallel to the magnetic core and one or more second segments defined by one or more conductive vias extending through the magnetic core or through dielectric surrounding the magnetic core.

21 Claims, 8 Drawing Sheets

(51) Int. Cl.

| | | |
|---|---|---|
| *H01F 27/28* | (2006.01) | |
| *H01F 41/04* | (2006.01) | |
| *H10D 1/20* | (2025.01) | |
| *H10W 70/685* | (2026.01) | |

(52) U.S. Cl.
CPC ............. *H01F 41/041* (2013.01); *H10D 1/20* (2025.01); *H10W 70/685* (2026.01); *H01F 2027/2809* (2013.01)

(58) Field of Classification Search
CPC .... H01L 23/49822; H10D 1/20; H05K 1/165; Y10T 29/4902; Y10T 29/49073
See application file for complete search history.

(56) References Cited

U.S. PATENT DOCUMENTS

| | | | | |
|---|---|---|---|---|
| 7,417,523 B2 * | 8/2008 | Waffenschmidt | ...... | H05K 1/165 336/200 |
| 8,269,594 B2 * | 9/2012 | Yoshimura | .......... | H01L 23/5227 336/200 |
| 11,594,370 B1 | 2/2023 | Pulugurtha et al. | | |

* cited by examiner

EMBEDDABLE COUPLED INDUCTORS FOR PACKAGED SEMICONDUCTOR DEVICES

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present disclosure relates generally to integrated circuits (ICs) and, more particularly, to package substrates and interposers for packaged semiconductor devices containing passive components embedded in a substrate core thereof.

Voltage regulation is mostly based on topologies where the inductor is the main element of energy storage (e.g., switching buck regulators). The inductor size, performance, and efficiency determine the overall performance for high-performance computing (HPC) applications. Due to ongoing increases in processor core counts, each processor core will have to be operated at its optimal voltage and frequency while minimizing losses. This requires optimal design at the power delivery network (PDN) to keep the supply voltage as close to the regulated one as possible. To prevent interconnection losses, the goal is to bring the voltage regulation near the load. However, this requires highly miniaturized and embeddable components.

BRIEF SUMMARY

The present disclosure contemplates various devices and methods for overcoming drawbacks accompanying the related art. One aspect of the embodiments of the present disclosure is a package substrate for a semiconductor device. The package substrate may comprise a substrate core and a coupled inductor embedded in the substrate core. The coupled inductor may comprise a double clad laminate including a dielectric layer and first and second metal layers sandwiching the dielectric layer. The first and second metal layers may be patterned to define spiral windings. The coupled inductor may further comprise first and second magnetic core layers sandwiching the double clad laminate.

Each of the first and second magnetic core layers may comprise a multilayered core including at least two magnetic films with adhesive therebetween. In each of the first and second magnetic core layers, the at least two magnetic films may include at least one material selected from the group consisting of CoNiFe, NiFe, and SiFe. The dielectric layer may comprise pre-preg. A thickness of the dielectric layer may be 25 μm-900 μm. The first and second metal layers may comprise copper. The coupled inductor may comprise a dielectric material between the double clad laminate and the first magnetic core layer and between the double clad laminate and the second magnetic core layer.

Another aspect of the embodiments of the present disclosure is a coupled inductor embeddable in a substrate core of a semiconductor device. The coupled inductor may comprise a double clad laminate including a dielectric layer and first and second metal layers sandwiching the dielectric layer. The first and second metal layers may be patterned to define spiral windings. The coupled inductor may further comprise first and second magnetic core layers sandwiching the double clad laminate.

Each of the first and second magnetic core layers may comprise a multilayered core including at least two magnetic films with adhesive therebetween. In each of the first and second magnetic core layers, the at least two magnetic films may include at least one material selected from the group consisting of CoNiFe, NiFe, and SiFe. The dielectric layer may comprise pre-preg. A thickness of the dielectric layer may be 25 μm-900 μm. The first and second metal layers may comprise copper. The coupled inductor may comprise a dielectric material between the double clad laminate and the first magnetic core layer and between the double clad laminate and the second magnetic core layer.

Another aspect of the embodiments of the present disclosure is a method of manufacturing a coupled inductor embeddable in a substrate core of a semiconductor device. The method may comprise providing a double clad laminate including a dielectric layer and first and second metal layers sandwiching the dielectric layer, patterning the first and second metal layers to define spiral windings, applying a dielectric material on a first side of the double clad laminate and on a second side of the double clad laminate opposite the first side, providing a first magnetic core layer on the dielectric material on the first side of the double clad laminate, and providing a second magnetic core layer on the dielectric material on the second side of the double clad laminate.

Each of the first and second magnetic core layers may comprise a multilayered core including at least two magnetic films with adhesive therebetween. In each of the first and second magnetic core layers, the at least two magnetic films may include at least one material selected from the group consisting of CoNiFe, NiFe, and SiFe. The dielectric layer of the double clad laminate may comprise pre-preg. A thickness of the dielectric layer of the double clad laminate may be 25 μm-900 μm. The first and second metal layers may comprise copper.

Another aspect of the embodiments of the present disclosure is a package substrate for a semiconductor device including a substrate core and a coupled inductor embedded in the substrate core. The coupled inductor may include a magnetic core embedded in a dielectric substrate, a first conductive winding surrounding the magnetic core, and a second conductive winding surrounding the magnetic core. Each of the conductive windings may include one or more first segments defined by metal patterning in a plane parallel to the magnetic core and one or more second segments defined by one or more conductive vias extending through the magnetic core or through dielectric surrounding the magnetic core.

Another aspect of the embodiments of the present disclosure is a coupled inductor embeddable in a substrate core of a semiconductor device. The coupled inductor may include a magnetic core embedded in a dielectric substrate, a first conductive winding surrounding the magnetic core, and a second conductive winding surrounding the magnetic core. Each of the conductive windings may include one or more first segments defined by metal patterning in a plane parallel to the magnetic core and one or more second segments defined by one or more conductive vias extending through the magnetic core or through dielectric surrounding the magnetic core.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 1 is an exploded perspective view of a coupled inductor that may be embedded into a substrate core of a semiconductor device;

DETAILED DESCRIPTION

The present disclosure encompasses various embodiments of coupled inductors embeddable into a substrate core of a semiconductor device, along with methods of manufacture thereof. The detailed description set forth below in connection with the appended drawings is intended as a description of several currently contemplated embodiments and is not intended to represent the only form in which the disclosed subject matter may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
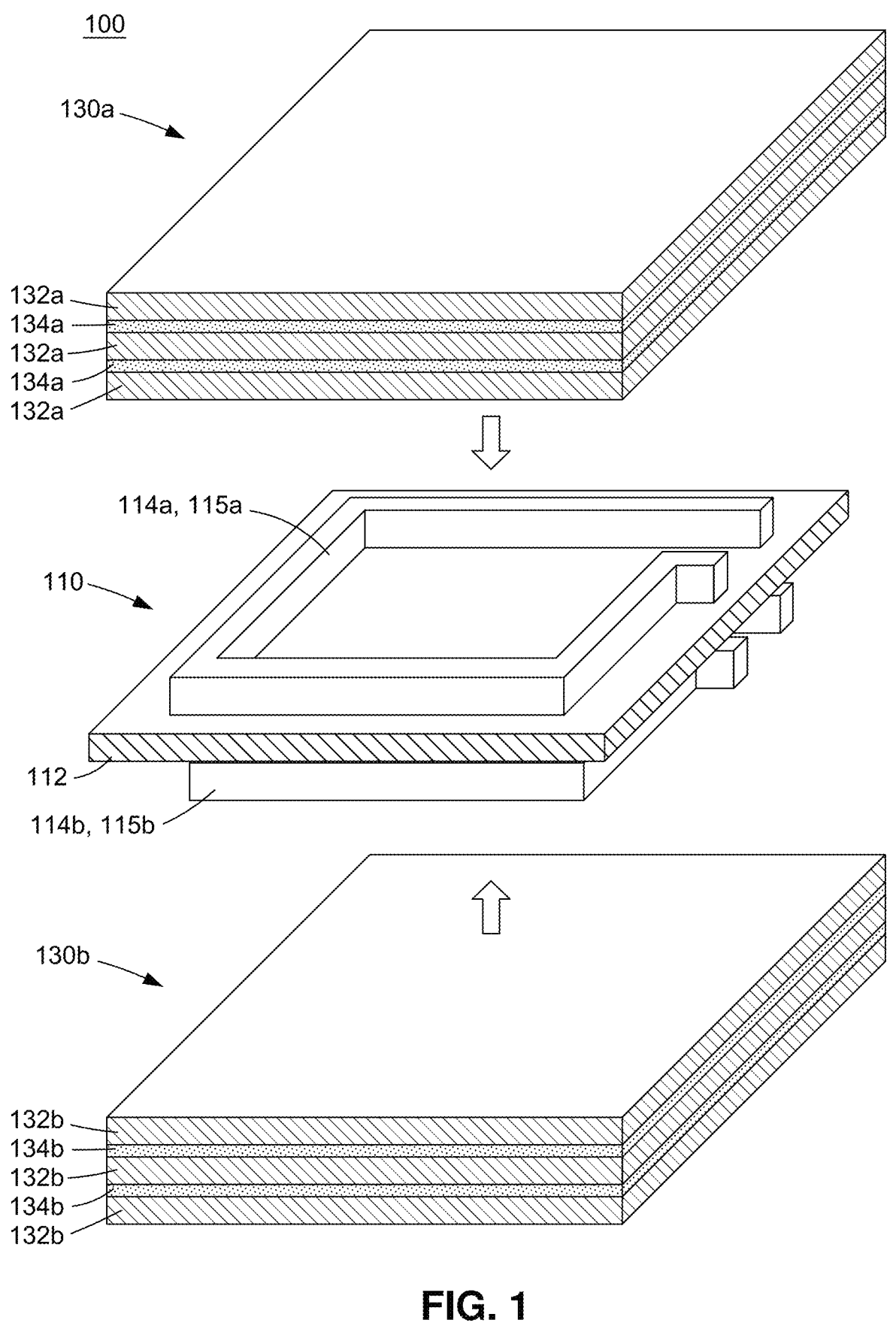
Figure 8:
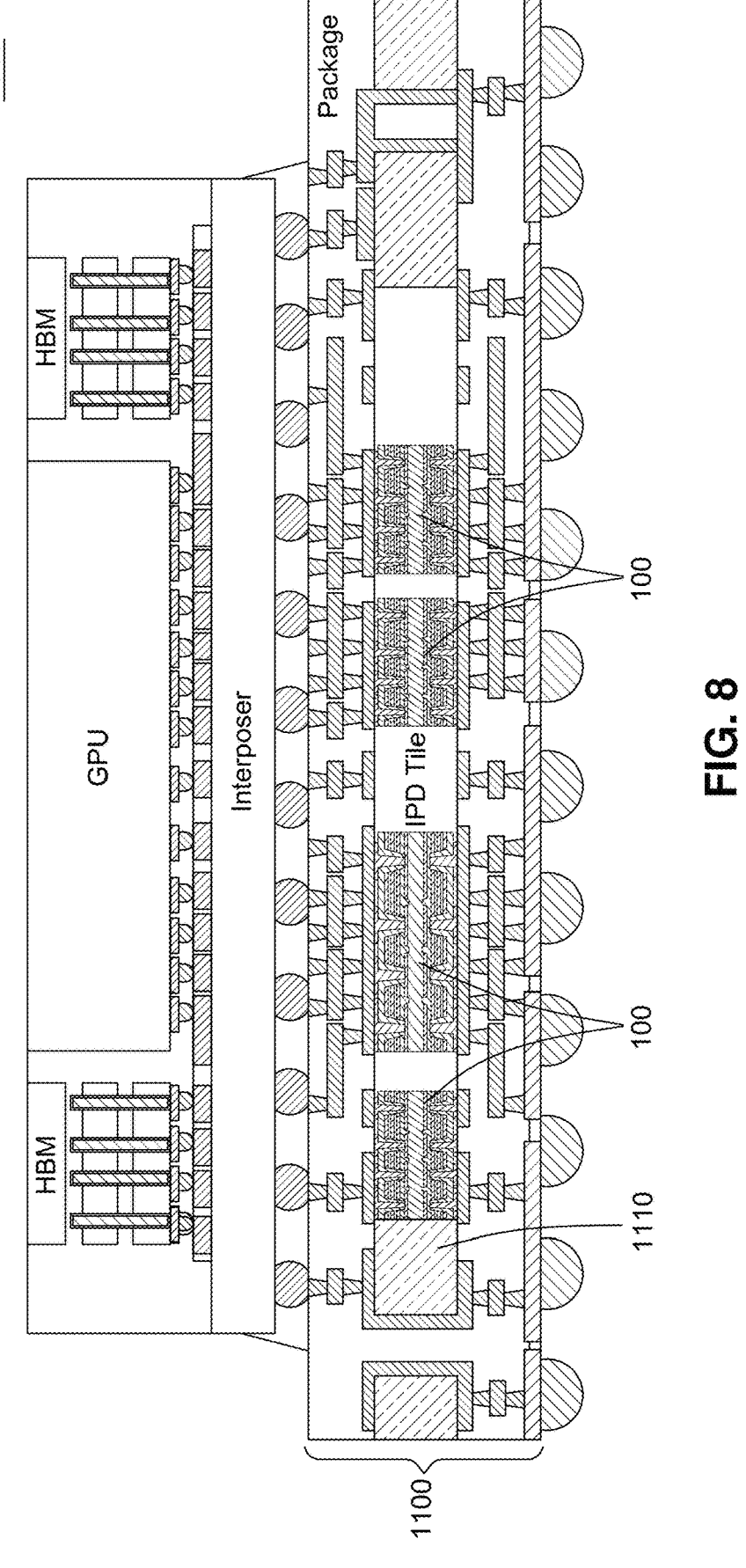
FIG. 8 is a cross-sectional view of a packaged semiconductor device including the coupled inductor of FIG. 1 embedded in a package substate thereof.

FIG. 1 is an exploded perspective view of a coupled inductor 100. As represented in FIG. 8, one or more such coupled inductors 100 may thereafter be conveniently disposed within, placed, formed, located, interposed, or otherwise embedded into a substrate, for example, into a substrate core of a semiconductor device 1000, such as a substrate core 1110 of a package substrate 1100 for an integrated circuit (e.g., GPU/AI with HBM memory) as illustrated or a substrate core of an interposer. The coupled inductor 100 may include a double clad laminate 110 including a dielectric layer 112 and first and second metal layers 114a, 114b sandwiching the dielectric layer 112. The first metal layer 114a and the second metal layer 114b may be patterned to define spiral windings 115a, 115b, which may be configured as coupled inductive windings (e.g., symmetrically arranged and having the same width and length of the Cu or other metal). The coupled inductor 100 may further include first and second magnetic core layers 130a, 130b. By virtue of the use of the double clad laminate 110 (having pre-preg as the dielectric layer 112, for example), the disclosed coupled inductor 100 may advantageously improve voltage regulation efficiency by coupling of the spiral windings 115a, 115b while also supporting an embedding architecture for maximum miniaturization.

The first magnetic core layer 130a may comprise a multilayered core including at least two magnetic films 132a with adhesive 134a therebetween. Likewise, the second magnetic core layer 130b may comprise a multilayered core including at least two magnetic films 132b with adhesive 134b therebetween. The multilayer magnetic materials serving as the first and second magnetic core layers 130a, 130b (which may preferably be soft magnetic materials having low coercivity, low core loss, and high permeability) may allow the disclosed coupled inductor 100 to function as a multiphase inductor. The coupled inductive windings may form two, three, four, or more phases. The integration of the coupled inductor 100 in a multiphase topology may beneficially take advantage of the current ripple reduction from the magnetic coupling for IVR applications. As a result, the disclosed coupled inductor 100 having the multilayered cores 130a, 130b may enable smaller footprint topologies and higher current handling, higher di/dt, and lower current ripple as compared to discrete technologies.

Figure 2:
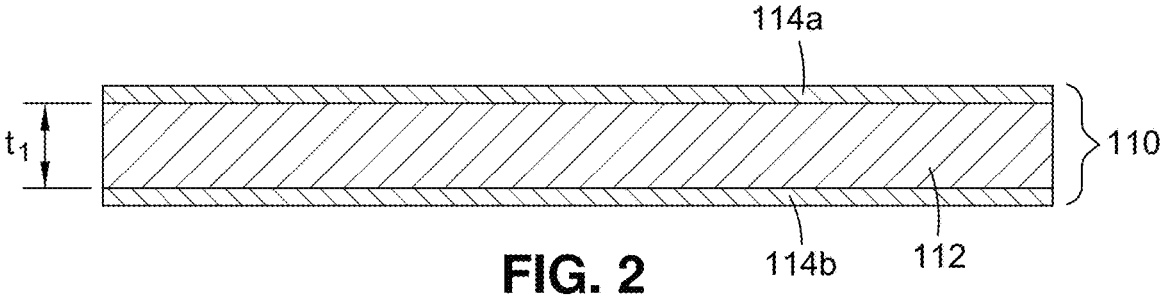
FIG. 2 is a cross-sectional view of a processing stage in manufacturing the coupled inductor of FIG. 1.
Figure 3:
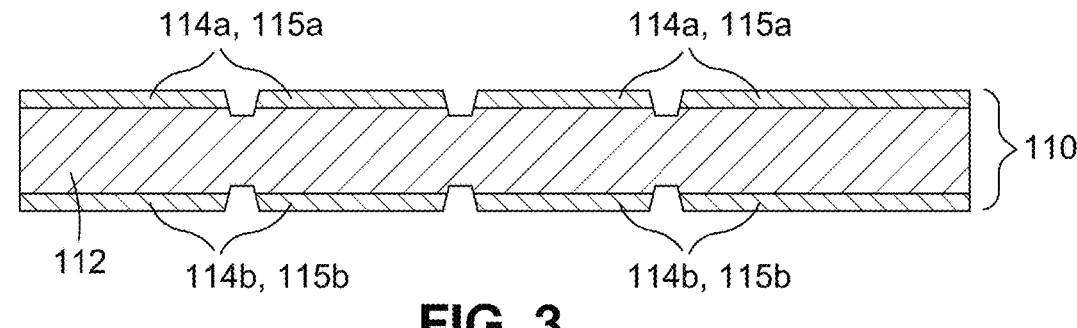
FIG. 3 is a cross-sectional view of another processing stage in manufacturing the coupled inductor of FIG. 1.

FIGS. 2-5 are cross-sectional views of processing stages in manufacturing the coupled inductor 100 shown in FIG. 1. Referring to FIG. 2, a method of manufacturing the coupled inductor 100 may begin with providing the double clad laminate 110 including the dielectric layer 112 and the first and second metal layers 114a, 114b sandwiching the dielectric layer 112. As shown in FIG. 3, the method may continue with patterning the first and second metal layers 114a, 114b (e.g., by laser ablation and/or etching) to define the spiral windings 115a, 115b. The dielectric layer 112 of the double clad laminate 110 may comprise pre-preg (e.g., liquid crystal polymer or LCP), for example, and may have thickness $t_1$ (see FIG. 2) of 10 μm-60 μm. The metal layers 114a, 114b may comprise copper (Cu), for example, and may each have a thickness of 5 μm to 80 μm. By manipulating the thickness $t_1$ of the dielectric layer 112, the coupling capability of the spiral windings 115a, 115b, and consequently their inductance, may be enhanced as needed for the particular application. In general, the thinner the dielectric layer 112, the better the inductive coupling. The coefficient of coupling k may be greater than 0.9, for example.

Figure 4:
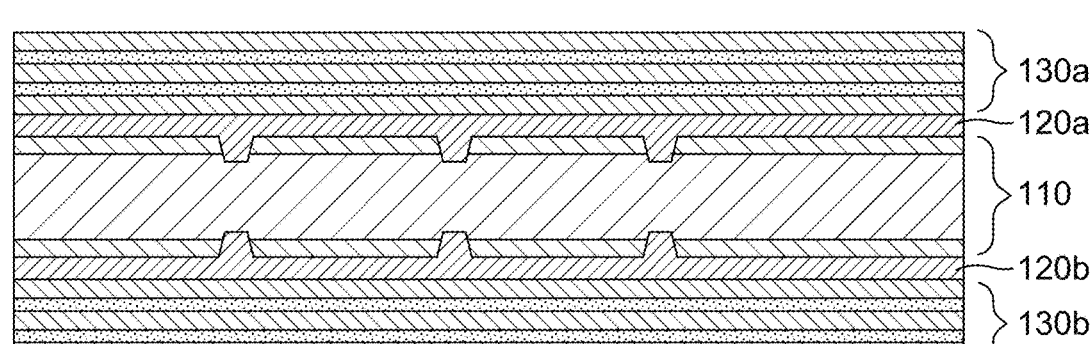
FIG. 4 is a cross-sectional view of another processing stage in manufacturing the coupled inductor of FIG. 1.
Figure 5:
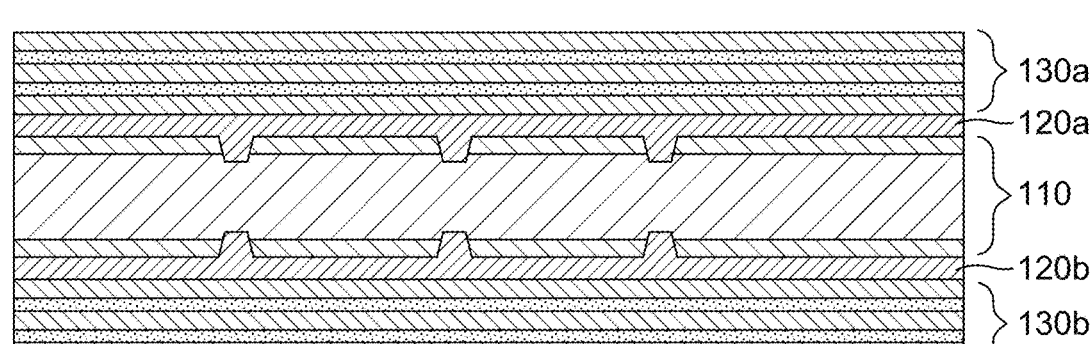
FIG. 5 is a cross-sectional view of another processing stage in manufacturing the coupled inductor of FIG. 1.

Referring to FIG. 4, the method of manufacturing the coupled inductor 100 may continue with applying a dielectric material 120a on a first side of the double clad laminate 110 and applying a dielectric material 120b on a second side of the double clad laminate 110 opposite the first side. The dielectric material, which may be a thermosetting film such as an Ajinomoto Build-up Film (ABF) for example, may cover the metal layers 114a, 114b while filling in between and around the portions of the first and second metal layers 114a, 114b that define the spiral windings 115a, 115b, thus providing electrical insulation and presenting an even surface on both sides of the patterned double clad laminate 110 for subsequent magnetic core integration. As shown in FIG. 5, the method may continue with providing the first magnetic core layer 130a on the dielectric material 120a on the first side of the double clad laminate 110 and providing the second magnetic core layer 130b on the dielectric material 120b on the second side of the double clad laminate 110. As noted above, each of the first and second magnetic core layers 130a, 130b may comprise a multilayered core including at least two magnetic films 132a, 132b with adhesive 134a, 134b therebetween. Such a multilayer magnetic core layers 130a, 130b may be made according to methods described in Applicant's own U.S. Pat. No. 11,594,370 ("the '370 patent"), entitled "Methods of Fabricating Stacked Magnetic Cores Having Small Footprints," the entire contents of which is incorporated by reference herein. In this regard, in each of the first and second magnetic core layers, the at least two magnetic films 132a, 132b in each of the first and second magnetic core layers 130a, 130b may include at least one material selected from the group consisting of CoNiFe, NiFe, and SiFe. By combining the coupling principles of the disclosed coupled inductor 100 with the multilayered structure made of CoNiFe, NiFe, and/or SiFe as described in the '370 patent, the inductance and current handling capabilities of the spiral windings 115a, 115b of the coupled inductor 100 may be significantly enhanced.

Figure 6:
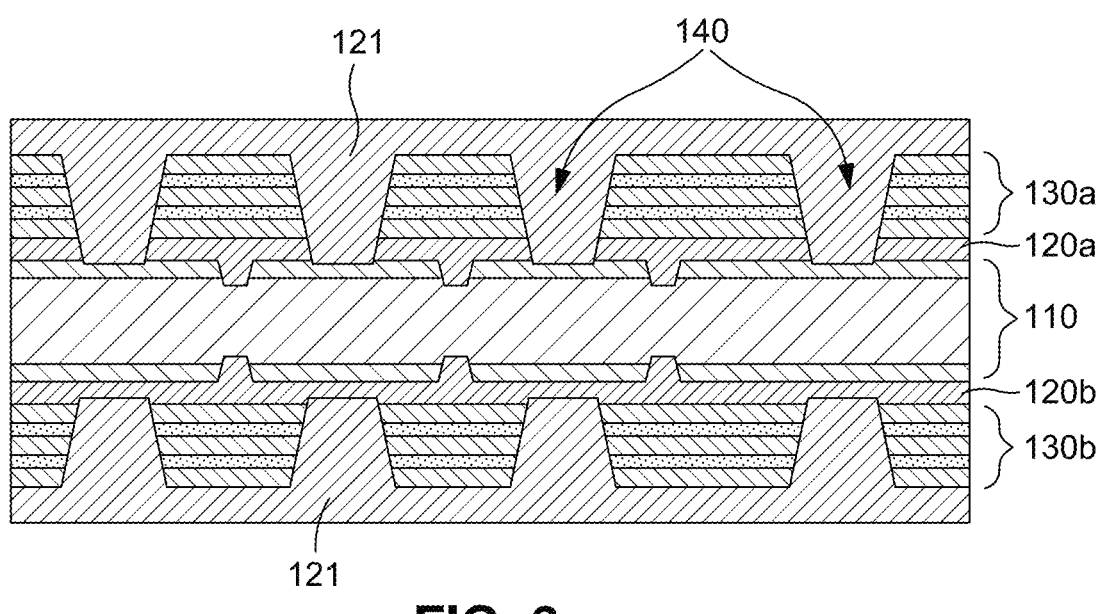
FIG. 6 is a cross-sectional view of another processing stage in manufacturing the coupled inductor of FIG. 1.
Figure 7:
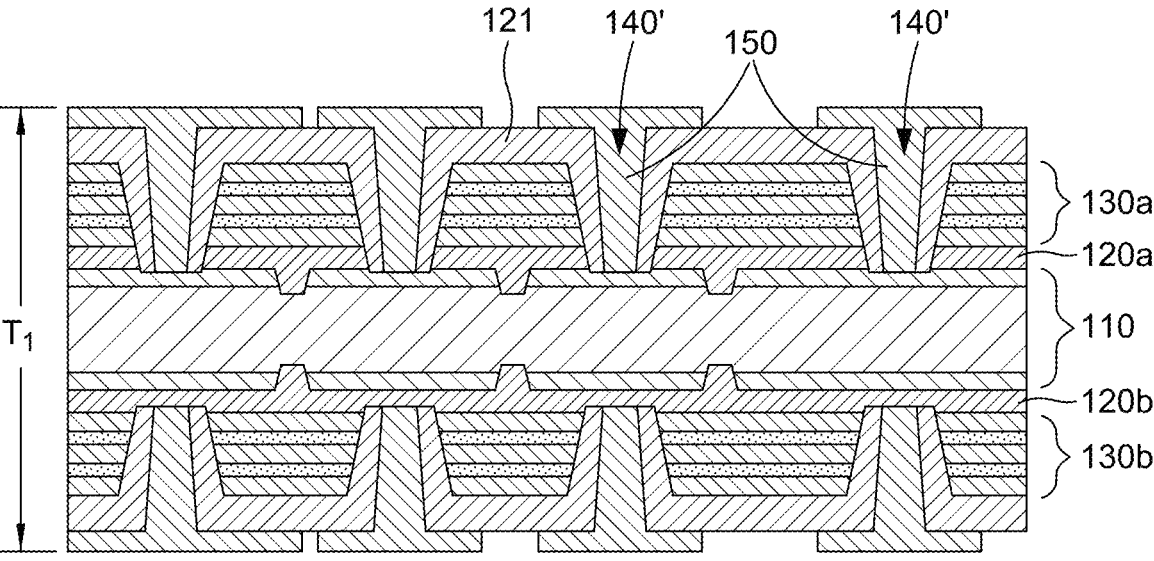
FIG. 7 is a cross-sectional view of another processing stage in manufacturing the coupled inductor of FIG. 1.

In order to connect the coupled inductor 100 to an external circuit, electrical connections to the metal layers 114a, 114b of the double clad laminate 110 (defining the spiral windings 115a, 115b) may be provided by formation of vias as illustrated in FIGS. 6 and 7. For example, referring to FIG. 6, cavities 140 may be formed by drilling or otherwise removing material from the magnetic core layers 130a, 130b and dielectric material 120a, 120b. Subsequently, the cavities 140 may be filled with a dielectric material 121 by a non-conductive lamination step. As shown in FIG. 7, vias may be redrilled within the dielectric material 121 to form narrower cavities 140' that are insulated from the magnetic core layers 130a, 130b by the dielectric material 121. The cavities 140' may then be filled with a conductive via fill 150 (e.g., by paste screen printing or electroless Cu) to establish the vias and bring out the electrodes to the top (and bottom) of the coupled inductor 100. The total thickness $T_1$ of the coupled inductor 100, including the double clad laminate 110, dielectric material 120a, 120b, magnetic core layers 130a, 130b, dielectric material 121, and metal 150, may be 0.5 mm to 1.2 mm. The completed coupled inductor 100 may be embedded in a substrate as shown in FIG. 8, prior to which the coupled inductor 100 may in some cases first be embedded in a tile as described in Applicant's own U.S. patent application Ser. No. 18/408,914 ("the '914 application"), filed Jan. 10, 2024 and entitled "Embeddable Tiles Containing Passive Devices for Packaged Semiconductor Devices," the entire contents of which is incorporated by reference herein.

By enabling the creation of coupled spiral inductors from double clad laminate, aspects of the disclosed subject matter make it possible to manipulate the dielectric layer's thickness, thereby enhancing the inductors' coupling capability and, consequently, their inductance. In general, spiral inductors may be widely used because of their high energy density due to their small area and length and low DC resistance. Spiral inductor applications may include multiphase buck converters and power supplies with switching frequencies in the 10-100 MHz where 10-200 nH may be required. The topologies range from buck converters or hybrid/resonant converters with switched capacitors to reduce the switching losses. Inductance densities range from around 10-100 nH/mm2, with lower values at 10 MHz and higher values at 1 MHz. Additionally, the disclosed coupled inductors may be connected to Voltage Regulator Modules (VRMs) separately as common mode chokes or in series to achieve higher inductance values with low leakage inductance, providing the most efficient energy transfer.

Figure 9:
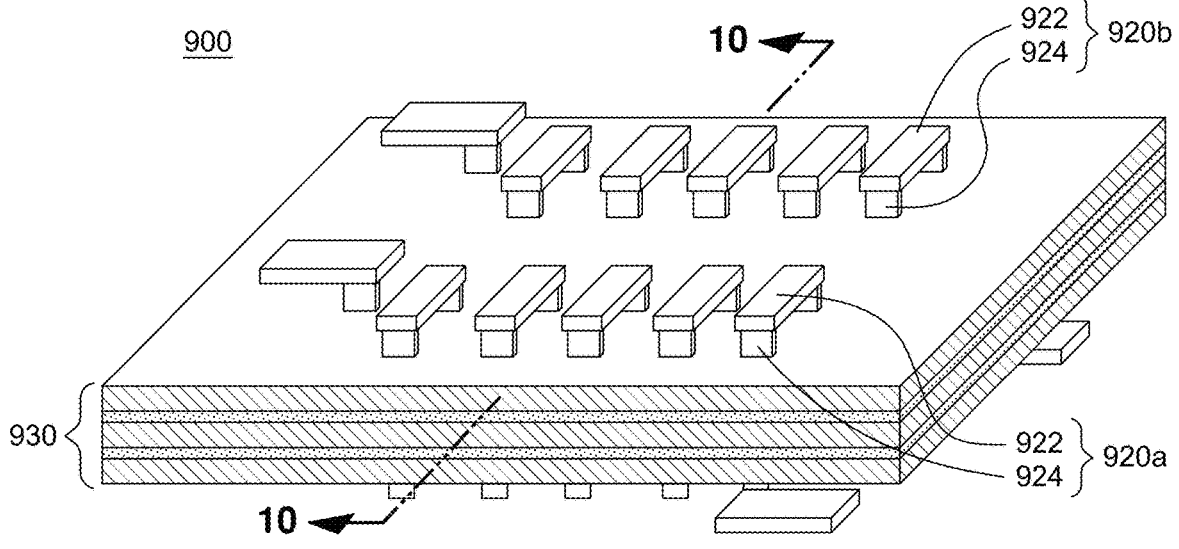
FIG. 9 is a perspective view of another coupled inductor that may be embedded into a substrate core of a semiconductor device.
Figure 10:
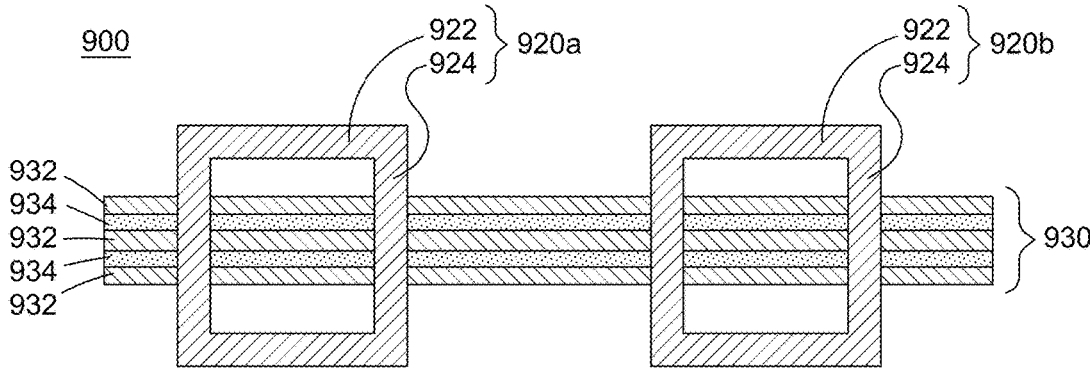
FIG. 10 is a cross-sectional view taken along the line 10-10 in FIG. 9.
Figure 19:
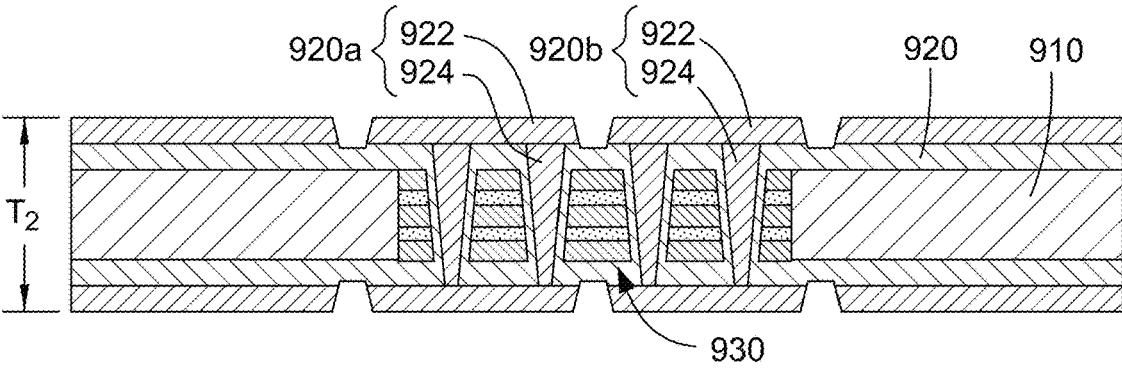
FIG. 19 is a cross-sectional view of another processing stage in manufacturing the coupled inductor of FIG. 9.
Figure 20:
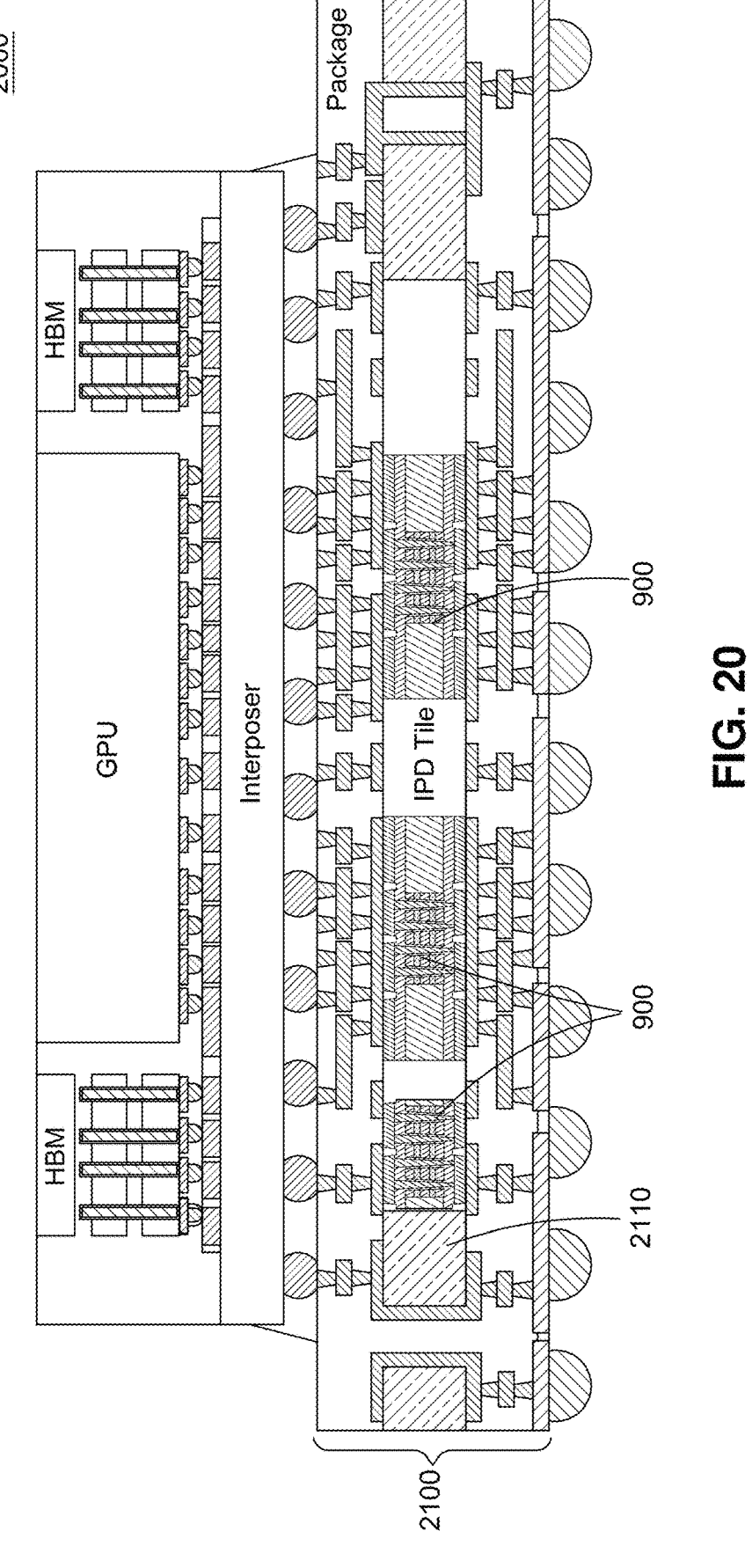
FIG. 20 is a cross-sectional view of a packaged semiconductor device including the coupled inductor of FIG. 9 embedded in a package substate thereof.

FIG. 9 is an exploded perspective view of a coupled inductor 900. FIG. 10 is a cross-sectional view taken along the line 10-10 in FIG. 9. As represented in FIG. 20, one or more such coupled inductors 900 may thereafter be conveniently embedded into a substrate core of a semiconductor device 2000, such as a substrate core 2110 of a package substrate 2100 for an integrated circuit (e.g., GPU/AI with HBM memory) as illustrated or a substrate core of an interposer. The coupled inductor 900 may include a magnetic core 930 embedded in a dielectric substrate 910 (see FIGS. 11-19), a first conductive winding 920a surrounding the magnetic core 930, and a second conductive winding 920b surrounding the magnetic core 930. Each of the conductive windings 920a, 920b may define a solenoidal or toroidal inductor and may include one or more first segments 922 defined by metal patterning in a plane parallel to the magnetic core 930 and one or more second segments 924 defined by one or more conductive vias extending through the magnetic core 930 or through dielectric surrounding the magnetic core 930. As such, the conductive winding 920a, 920b of the coupled inductor 900 may additionally serve as a passthrough electrical connection as may be needed depending on the particular application, making it unnecessary to introduce additional passthrough connections that would take up extra space.

Like the magnetic core layers 130a, 130b of the coupled inductor 100 described in relation to FIGS. 1-8, the magnetic core 930 of FIGS. 9-20 may comprise a multilayered core including at least two magnetic films 932 with adhesive 934 therebetween. The multilayer magnetic materials serving as the magnetic core 930 (which may be the same as those described above in relation to the magnetic core layers 130a, 130b) may allow the disclosed coupled inductor 900 to function as a multiphase inductor. The coupled inductive windings may form two, three, four, or more phases. The integration of the coupled inductor 900 in a multiphase topology may beneficially take advantage of the current ripple reduction from the magnetic coupling for IVR applications. As a result, the disclosed coupled inductor 900 having the multilayered core 930 may enable smaller footprint topologies and higher current handling, higher di/dt, and lower current ripple as compared to discrete technologies.

Figure 11:
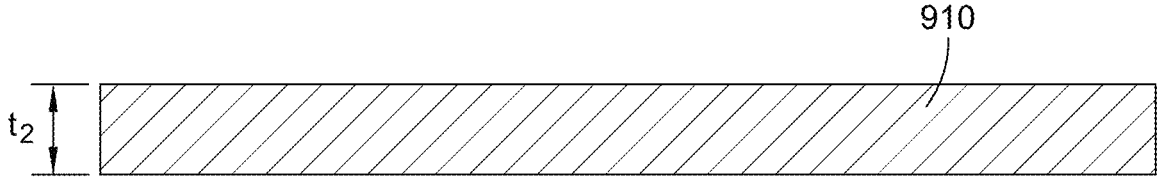
FIG. 11 is a cross-sectional view of a processing stage in manufacturing the coupled inductor of FIG. 9.
Figure 12:
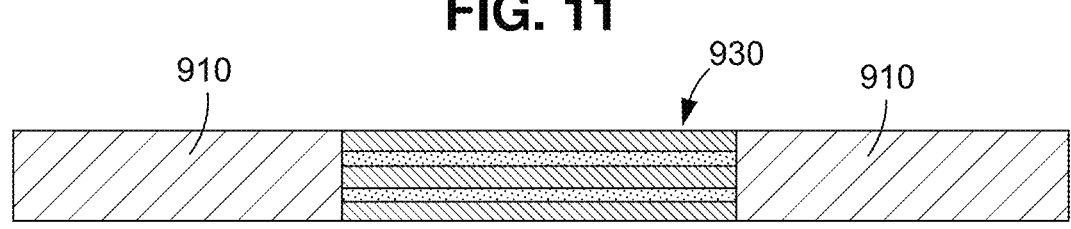
FIG. 12 is a cross-sectional view of another processing stage in manufacturing the coupled inductor of FIG. 9.

FIGS. 11-19 are cross-sectional views of processing stages in manufacturing the coupled inductor 900 shown in FIGS. 9 and 10. Referring to FIG. 11, a method of manufacturing the coupled inductor 900 may begin with providing the dielectric substrate 910. The dielectric substrate 910 may comprise pre-preg (e.g., LCP), for example, and may have a thickness $t_2$ of 100 μm to 200 μm (e.g., 170 μm). As shown in FIG. 12, the method may continue with exposing a portion of the dielectric substrate 910 (e.g., by laser ablation or etching) to produce a cavity and inserting the magnetic core 930 into the cavity. The magnetic core 930 can be inserted into the dielectric substrate 910 with appropriate clearances for placement errors, and then any remaining portion of the cavity may be filled with dielectric to eliminate the clearance or gap. In the case of a multilayer magnetic core 930 as described above, the methods described in the '370 patent may be used, and the magnetic films 932 may include at least one material selected from the group consisting of CoNiFe, NiFe, and SiFe. By combining the coupling principles of the disclosed coupled inductor 900 with the multilayered structure made of CoNiFe, NiFe, and/or SiFe as described in the '370 patent, the inductance and current handling capabilities of the conductive windings 920a, 920b of the coupled inductor 900 may be significantly enhanced.

Figure 13:
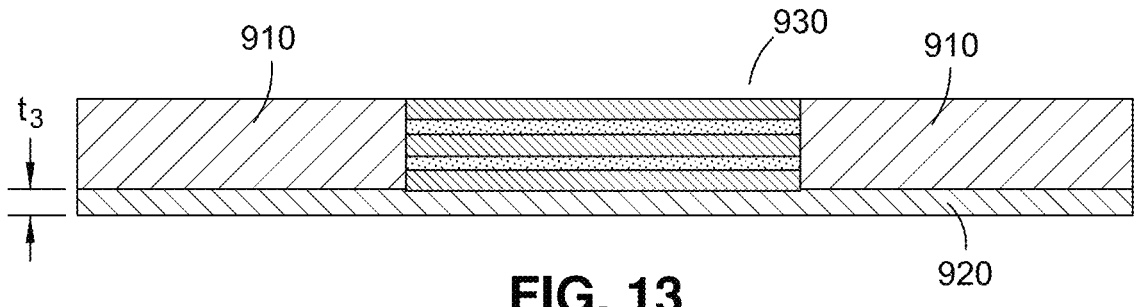
FIG. 13 is a cross-sectional view of another processing stage in manufacturing the coupled inductor of FIG. 9.

A dielectric material 920 such as a thermosetting film (e.g., ABF) may then be applied to one side of the dielectric substrate 910 and magnetic core 930 as shown in FIG. 13. This may be the bottom side as shown in the illustrated exampled. The dielectric material 920 may form a layer on the dielectric substrate 910 having a thickness $t_3$ of 10 µm to 40 µm, for example, and may be left partially cured so as to form a continuous dielectric region with additional dielectric material 920 to be applied in a later processing step. The same dielectric material 920 may be used to fill around the magnetic core 930 and eliminate any remaining clearance as described above.

Figure 14:
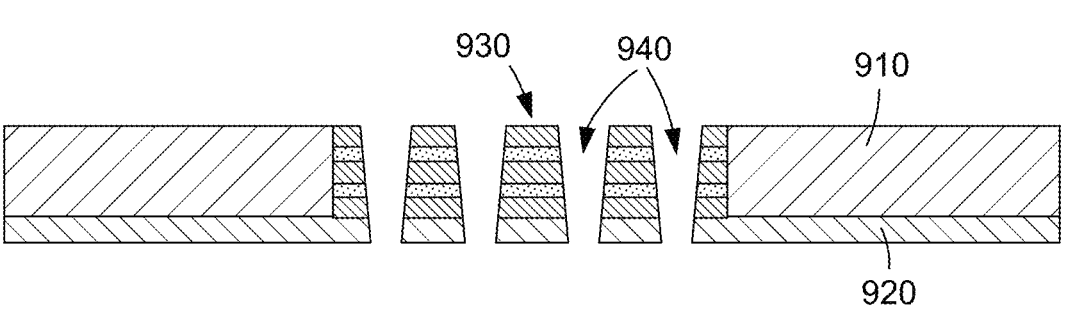
FIG. 14 is a cross-sectional view of another processing stage in manufacturing the coupled inductor of FIG. 9.
Figure 14:
Figure 15:
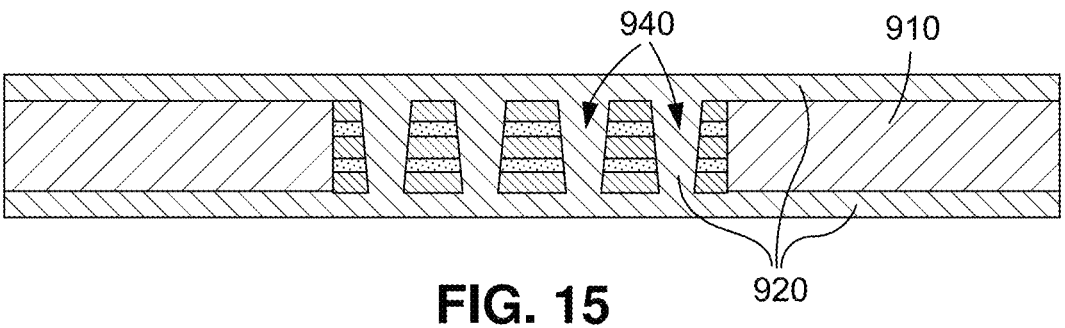
FIG. 15 is a cross-sectional view of another processing stage in manufacturing the coupled inductor of FIG. 9.
Figure 16:
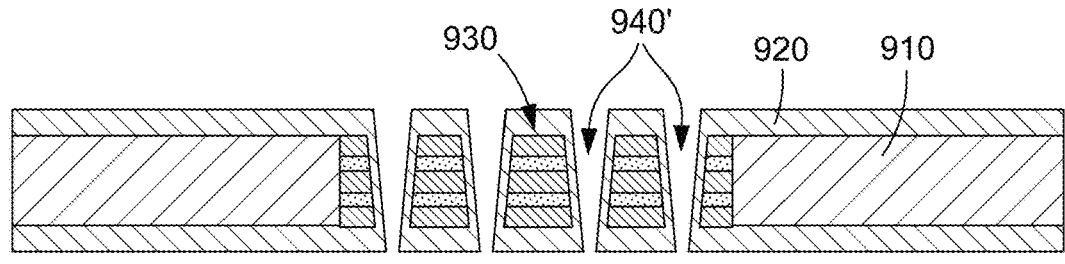
FIG. 16 is a cross-sectional view of another processing stage in manufacturing the coupled inductor of FIG. 9.
Figure 17:
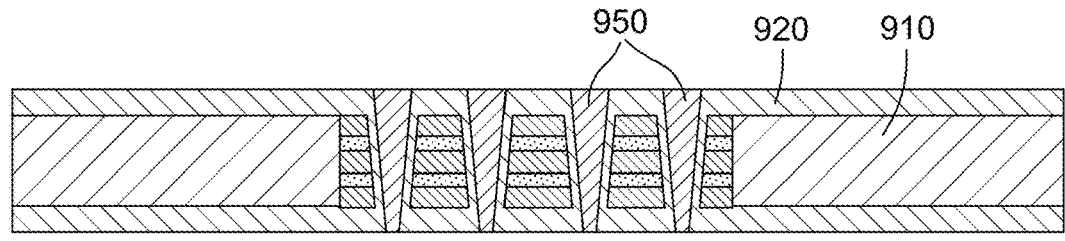
FIG. 17 is a cross-sectional view of another processing stage in manufacturing the coupled inductor of FIG. 9.

Referring to FIG. 14, the method of manufacturing the coupled inductor 900 may continue with removing a portion of the magnetic core 930 and dielectric material 920 (e.g., by laser ablation or etching) to create through holes 940 for vias 950 (see FIG. 17). Alternatively, the through holes 940 may be created in the dielectric substrate 910 around the magnetic core 930 (or in dielectric material 920 that surrounds the magnetic core 930 such as may have been used to fill in any clearance between the magnetic core 930 and the dielectric substrate 910. As shown in FIG. 15, the through holes 940 may then be filled with dielectric material, such as the same dielectric material 920 (which may form a continuous region of dielectric material 920 with the partially cured bottom layer), such that the through holes 940 may be completely filled by the dielectric material 920 and the dielectric material 920 may form another layer on the other side of the dielectric substrate 910 and magnetic core 930 having a thickness of 10 µm to 40 µm (e.g., 45 µm), for example. This may be the top side as shown in the illustrated example. As shown in FIG. 16, a portion of the dielectric material 920 may then be removed (e.g., by laser ablation or etching) to define through holes 940' at the site of through holes 940 while leaving some of the dielectric material 920 to insulate the through holes 940' from the magnetic core 930. The through holes 940' may then be filled with conductive via fill 950 to define vias as shown in FIG. 17. If the through holes 940 were formed in dielectric, the conducive vias may consequently be formed in the dielectric surrounding the magnetic core 930 rather than in the magnetic core 930.

Figure 18:
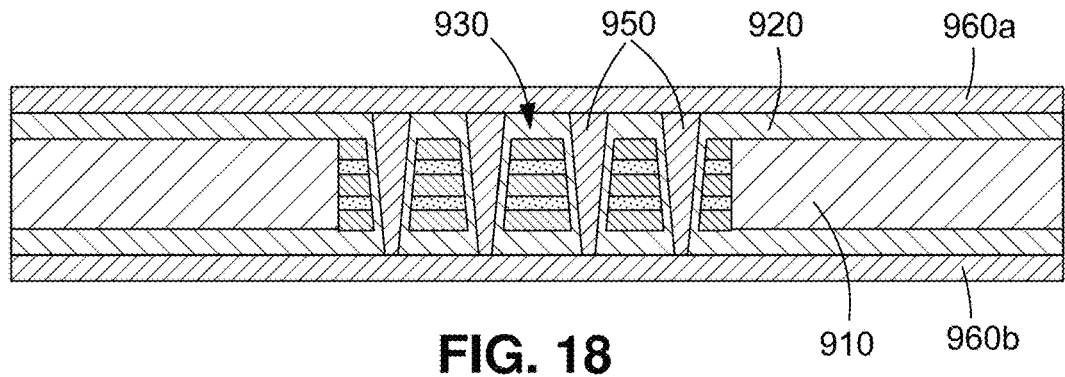
FIG. 18 is a cross-sectional view of another processing stage in manufacturing the coupled inductor of FIG. 9.

Referring to FIG. 18, the method of manufacturing the coupled inductor 900 may continue with depositing metal such as Ag, Au, Cu, Pt, Pd, and/or composites or alloys of the aforementioned metals on the dielectric material 920 on both sides (e.g., top and bottom) of the dielectric substrate 910 and magnetic core 930 so as to be in electrical contact with the conductive via fill 950 of the vias while being electrically insulated from the magnetic core 930. The deposited metal may form metal layers 960a, 960b respectively defining top and bottom sides of the coupled inductor 900 as shown. It is contemplated that the metal layers 960a, 960b and the conductive via fill of the vias 950 may be applied in one continuous depositing step. As shown in FIG. 19, the method may continue with patterning the metal layers 960a, 960b to define the one or more first segments 922 of the conductive windings 920a, 920b. As noted with reference to FIGS. 1 and 2, the conductive windings 920a, 920b may include one or more first segments 922 defined by the metal patterning and one or more second segments 924 defined by the conductive via(s) 950 extending through the magnetic core 930. The metal patterning of the metal layers 960a, 960b may further define inductor terminals electrically connected to the conductive windings 960a, 960b. The total thickness $T_2$ of the coupled inductor 900, including the magnetic core 930, dielectric material 920, and metal layers 960a, 960b, may be 150 µm to 400 µm. The completed coupled inductor 900 may be embedded in a substrate as shown in FIG. 20, prior to which the coupled inductor 900 may in some cases first be embedded in a tile as described in the '914 application.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of manufacturing a coupled inductor embeddable in a package substrate of a semiconductor device, the method comprising:

providing a double clad laminate including a dielectric layer and first and second metal layers sandwiching the dielectric layer;

patterning the first and second metal layers to define spiral windings;

applying a dielectric material on a first side of the double clad laminate and on a second side of the double clad laminate opposite the first side;

providing a first magnetic core layer on the dielectric material on the first side of the double clad laminate;

providing a second magnetic core layer on the dielectric material on the second side of the double clad laminate;

covering the first magnetic core layer with a dielectric material to define a first outer surface of the coupled inductor; and forming at least one via to provide electrical connection from the first outer surface of the coupled inductor to the first metal layer.

2. The method of claim 1, wherein each of the first and second magnetic core layers comprises a multilayered core including at least two magnetic films with adhesive therebetween.

3. The method of claim 2, wherein, in each of the first and second magnetic core layers, the at least two magnetic films include at least one material selected from the group consisting of CoNiFe, NiFe, and SiFe.

4. The method of claim 1, wherein the dielectric layer of the double clad laminate comprises pre-preg.

5. The method of claim 1 wherein a thickness of the dielectric layer of the double clad laminate is 25 µm-900 µm.

6. The method of claim 1, wherein the first and second metal layers comprise copper.

7. The method of claim 1, further comprising:

covering the second magnetic core layer with a dielectric material to define a second outer surface of the coupled inductor; and forming at least one via to provide electrical connection from the second outer surface of the coupled inductor to the second metal layer.

8. A method of manufacturing a semiconductor device, the method comprising:

providing a first magnetic core layer;

providing a second magnetic core layer;

providing a double clad laminate between the first and second magnetic core layers, the double clad laminate including a dielectric layer and first and second metal layers sandwiching the dielectric layer;

patterning the first and second metal layers to define spiral windings, thereby producing a coupled inductor comprising the first magnetic core layer, the second magnetic core layer, and the double clad laminate that is between the first and second magnetic core layers and includes the dielectric layer and the patterned first and second metal layers;

covering the first magnetic core layer with a dielectric material to define a first outer surface of the coupled inductor;

forming at least one via to provide electrical connection from the first outer surface of the coupled inductor to the first metal layer; and embedding the coupled inductor in a package substrate of the semiconductor device.

9. The method of claim 8, wherein each of the first and second magnetic core layers comprises a multilayered core including at least two magnetic films with adhesive therebetween.

10. The method of claim 9, wherein, in each of the first and second magnetic core layers, the at least two magnetic films include at least one material selected from the group consisting of CoNiFe, NiFe, and SiFe.

11. The method of claim 8, wherein the dielectric layer of the double clad laminate comprises pre-preg.

12. The method of claim 8 wherein a thickness of the dielectric layer of the double clad laminate is 25 µm-900 µm.

13. The method of claim 8, wherein the first and second metal layers comprise copper.

14. The method of claim 8, further comprising:

applying a dielectric material between the first magnetic core layer and a first side of the double clad laminate; and applying a dielectric material between the second magnetic core layer and a second side of the double clad laminate opposite the first side.

15. A method of manufacturing a coupled inductor embeddable in a package substrate of a semiconductor device, the method comprising:

providing a first magnetic core layer;

providing a second magnetic core layer;

providing a double clad laminate between the first and second magnetic core layers, the double clad laminate including a dielectric layer and first and second metal layers sandwiching the dielectric layer;

patterning the first and second metal layers to define spiral windings;

covering the first magnetic core layer with a dielectric material to define a first outer surface of the coupled inductor; and forming at least one via to provide electrical connection from the first outer surface of the coupled inductor to the first metal layer.

16. The method of claim 15, wherein each of the first and second magnetic core layers comprises a multilayered core including at least two magnetic films with adhesive therebetween.

17. The method of claim 16, wherein, in each of the first and second magnetic core layers, the at least two magnetic films include at least one material selected from the group consisting of CoNiFe, NiFe, and SiFe.

18. The method of claim 15, wherein the dielectric layer of the double clad laminate comprises pre-preg.

19. The method of claim 15 wherein a thickness of the dielectric layer of the double clad laminate is 25 µm-900 µm.

20. The method of claim 15, wherein the first and second metal layers comprise copper.

21. The method of claim 15, further comprising:

applying a dielectric material between the first magnetic core layer and a first side of the double clad laminate; and applying a dielectric material between the second magnetic core layer and a second side of the double clad laminate opposite the first side.

* * * * *